United States Patent [19]

Shulick

[11] Patent Number: 5,171,336
[45] Date of Patent: Dec. 15, 1992

[54] PURGE AIR SYSTEM

[76] Inventor: Robert J. Shulick, 5N233 Bluff Dr., St. Charles, Ill. 60175

[21] Appl. No.: 845,859

[22] Filed: Mar. 3, 1992

Related U.S. Application Data

[63] Continuation of Ser. No. 717,548, Jun. 17, 1991, abandoned.

[51] Int. Cl.$^5$ .............................................. B01D 53/04
[52] U.S. Cl. ........................................ 55/271; 55/275; 55/316; 55/387; 55/DIG. 17
[58] Field of Search ................... 55/18, 31, 33, 35, 74, 55/161–163, 179, 216, 219, 271, 274, 275, 316, 387

[56] References Cited

U.S. PATENT DOCUMENTS

| | | | |
|---|---|---|---|
| 233,492 | 10/1880 | Field. | |
| 240,236 | 4/1881 | Delany. | |
| 275,195 | 4/1883 | Green. | |
| 275,387 | 4/1883 | Hunter. | |
| 580,584 | 4/1897 | Robertson. | |
| 2,471,376 | 5/1949 | Peters | 55/162 |
| 2,505,581 | 4/1950 | Unger | 174/14 |
| 2,506,578 | 5/1950 | Case | 55/161 |
| 2,584,889 | 2/1952 | Latour | 55/33 X |
| 2,671,526 | 3/1954 | Hunt et al. | 55/275 |
| 2,783,547 | 3/1957 | Bieger et al. | 55/162 X |
| 3,144,314 | 8/1964 | Jackson | 55/179 |
| 3,155,471 | 11/1964 | Schymik et al. | 55/179 X |
| 3,243,560 | 3/1966 | Wilson | 200/148 |
| 3,323,291 | 6/1967 | Kern | 55/162 |
| 3,543,482 | 12/1970 | Foster | 55/162 |
| 3,705,480 | 12/1972 | Wireman | 55/275 |
| 3,889,484 | 6/1975 | Vander Horst et al. | 62/5 |
| 4,211,542 | 7/1980 | Kramer | 55/179 |
| 4,231,768 | 11/1980 | Seibert et al. | 55/179 |
| 4,278,453 | 7/1981 | Klein | 55/275 |
| 4,417,295 | 11/1983 | Stuckert | 361/384 |
| 4,530,272 | 7/1985 | Stokes | 55/210 |
| 4,698,075 | 10/1987 | Dechene | 55/163 |
| 4,784,675 | 11/1988 | Leber et al. | 55/213 |
| 4,802,899 | 2/1989 | Vrana et al. | 55/161 |
| 4,877,422 | 10/1989 | Walbridge et al. | 55/163 X |
| 4,897,094 | 1/1990 | Maeda | 55/219 |
| 4,898,599 | 2/1990 | Settlemyer | 55/33 X |
| 4,925,466 | 5/1990 | Overby | 55/219 X |
| 4,999,034 | 3/1991 | Mager et al. | 55/275 |

Primary Examiner—Robert Spitzer
Attorney, Agent, or Firm—Wood, Phillips, VanSanten, Hoffman & Ertel

[57] ABSTRACT

A purge air system is disclosed. The system provides a common source of a periodic flow of dry air and a continuous flow of dry air for delivery to a plurality of remote control boxes containing electronic components. The purge air system includes a common cabinet which houses a dryer connected to receive air from an inlet for removal of moisture from the air, a continuous flow outlet connected to receive dry air from the dryer, a periodic flow outlet connected to receive dry air from the dryer to provide a source of periodic flow of dry air, and a periodic flow valve connected to regulate the flow of dry air from the dryer to the periodic flow outlet. Conduits connect the outlets to the remote control boxes. The periodic flow valve may be controlled by an adjustable timer, to provide a cyclical flow of dry air for periods of from one to thirty seconds followed by non-flow periods of from about one to sixty minutes. Pre-filters may be employed to pretreat the air prior to entrance into the dryer.

21 Claims, 1 Drawing Sheet

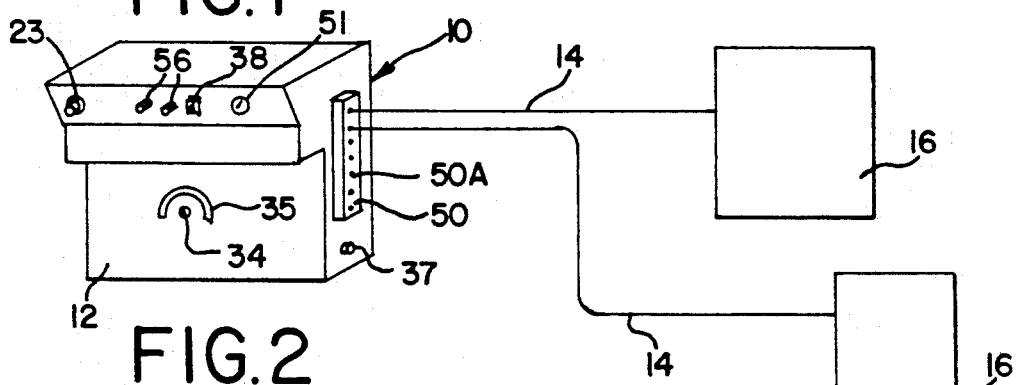
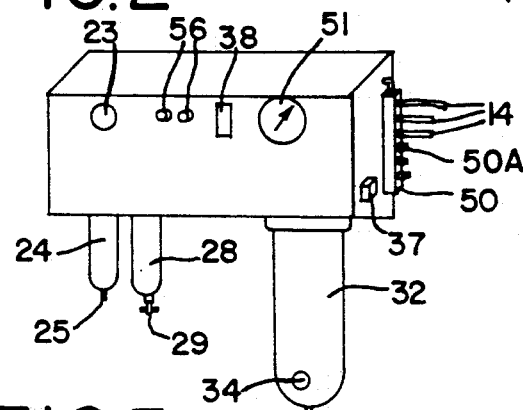
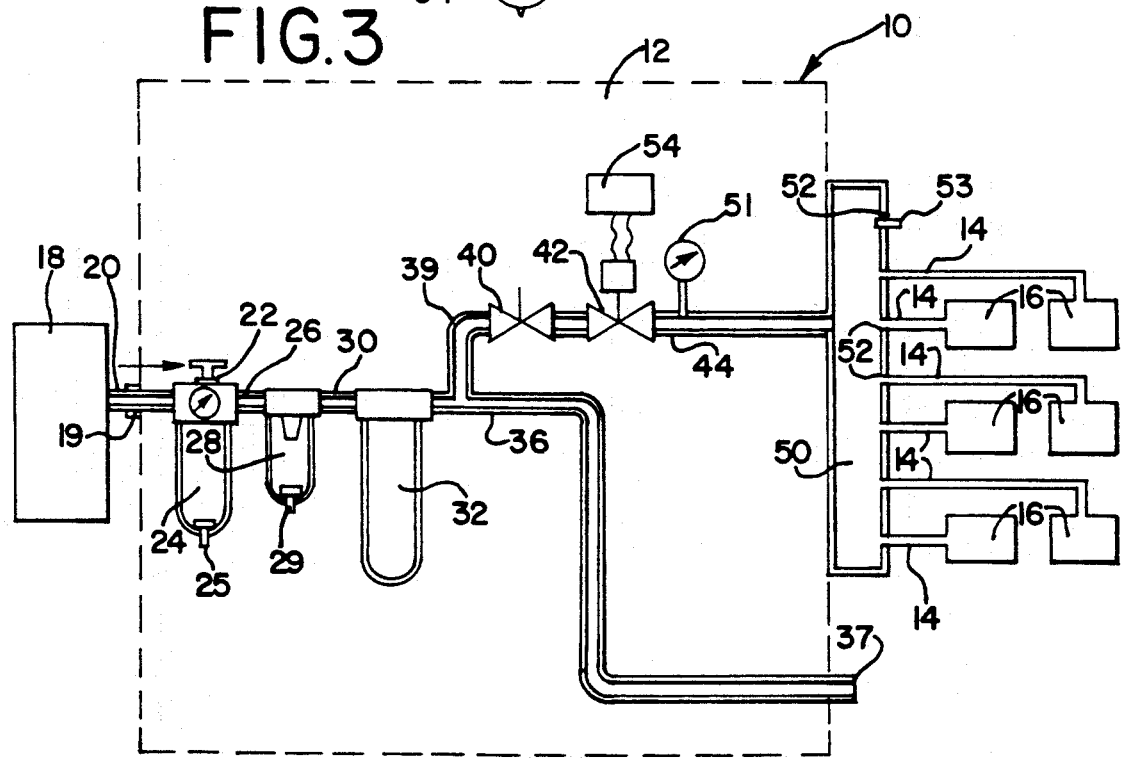

PURGE AIR SYSTEM

This application is a continuation, of application Ser. No. 717,548, filed June 17, 1991, now abandoned.

BACKGROUND OF THE INVENTION

1. Field of the Invention

The present invention relates to a system for controlling the environment to which electronic components are exposed, and relates more specifically to a system for controlling the humidity levels in control boxes housing electronic components.

2. Background of the Invention

It has been recognized that a humid environment can be detrimental to the efficient operation and longevity of electrical and electronic components. Various drying schemes have been suggested for alleviating this problem, some of which have involved the use of desiccant beds. However, in using such desiccant beds containing materials such as silica gel, it becomes necessary to replace the silica gel as it becomes saturated with moisture. When desiccant beds are used in a plurality of control boxes containing electronic components, it becomes necessary to monitor and maintain these desiccant beds at a plurality of locations. When such systems are operated on a continuous flow basis, such systems may be inefficient: once the control boxes have been initially dried, a continuous flow of new dry air around the electronic components may not be necessary to maintain the desired dryness.

SUMMARY OF THE INVENTION

It is an object of the present invention to minimize detrimental atmospheric conditions within control boxes containing electronic components.

It is a further object of the present invention to reduce maintenance costs and premature component failure caused by moisture and corrosion due to wet, corrosive or damp conditions in such control boxes.

It is a further object of the present invention to maintain a dry, oil-free atmosphere within such control boxes.

It is a further object of the present invention to absorb moisture that enters such control boxes.

It is a further object of the present invention to provide a ready source of dry, oil-free air for use in controlling the atmospheric conditions within such control boxes.

It is a further object of the present invention to provide a source of a periodic flow of dry, oil-free purge air for delivery to such control boxes.

It is a further object of the present invention to provide a source of a variable periodic flow of dry, oil-free purge air for delivery to such control boxes.

It is a further object of the present invention to provide a source of a continuous flow of dry, oil-free purge air for delivery to such control boxes.

It is a further object of the present invention to provide a common source of dry, oil-free purge air for delivery to a plurality of such control boxes at remote locations.

It is a further object of the present invention to provide a common source of both a continuous flow and a periodic flow of dry, oil-free purge air for delivery to such control boxes.

It is a further object of the present invention to increase the working life of desiccant materials used in drying air in such a purge air system.

In one aspect, the present invention meets some of these objectives by furnishing a dry air system which provides a source of continuous and intermittent flow of dry air. The system comprises an air source connected to a dryer. The dryer receives air from the air source and removes moisture from the air. A continuous flow outlet receives dry air from the dryer and provides an outlet for a substantially continuous flow of substantially dry air. An intermittent flow valve receives dry air from the dryer; it opens intermittently to provide an intermittent flow of substantially dry air. An intermittent flow outlet is connected to the intermittent flow valve and provides a source of an intermittent flow of substantially dry air.

In another aspect, the present invention provides a purge air system providing a common source of both a periodic flow of dry air and a continuous flow of dry air for delivery to a plurality of remote control boxes containing electronic components. The purge air system comprises an air source and a common cabinet. The common cabinet includes an inlet for receipt of air from the air source, a dryer connected to receive air from the inlet for removal of moisture from the air, a continuous flow outlet connected to receive dry air from the dryer, a periodic flow outlet connected to receive dry air from the dryer to provide a source of periodic flow of dry air, and a periodic flow valve connected to regulate the flow of dry air from the dryer to the periodic flow outlet. Conduits connect the outlets to the remote control boxes. Thus, depending upon the conditions within the particular control box, either a continuous or a periodic flow of treated air may be supplied to the control box.

In yet another aspect, the present invention provides a purge air system for providing an adjustable cyclical flow of dry air. A dryer removes water from the air. A periodic flow valve regulates the flow of dry air from the dryer. An adjustable timer regulates the operation of the periodic flow valve so that dry air may flow through the periodic flow valve for a period of from one to thirty seconds followed by a period of non-flow of from one to sixty minutes.

BRIEF DESCRIPTION OF THE DRAWINGS

FIG. 1 is a schematic illustration of a centralized purge air system with a common purge air cabinet, a plurality of external conduits for delivery of purge air to a plurality of remote control boxes, and a source of compressed air for input into the centralized cabinet.

FIG. 2 illustrates a centralized purge air system with filters and a dryer mounted on an exterior wall of the central cabinet.

FIG. 3 illustrates the purge air system of FIG. 1, with the components of the centralized purge air system illustrated schematically.

DESCRIPTION OF THE ILLUSTRATED EMBODIMENT

As shown in the accompanying drawings, the purge air system 10 of the present invention includes a purge air cabinet 12 which serves as a common source of a continuous flow and a periodic flow of clean, oil-free, dry air for delivery through external conduits 14 to a plurality of remote control boxes 16 containing electronic components. A source of compressed air 18, external to the common cabinet 12, is connected to an inlet 19 on the exterior of the cabinet through a conduit 20. The compressed air is filtered and dried and then delivered to the remote control boxes 16.

The inlet 19 may be any suitable pipe connection, such as a one-half inch female pipe connection. Any suitable source of compressed air may be used in conjunction with the purge air system cabinet of the present invention. Furthermore, the purge air system of the present invention may also be used in conjunction with other air sources, such as a fan system for drawing and conveying purge air through the system.

The purge air system cabinet 12 may be wall-mounted within a space in which several different electronic control boxes 16 are set up. The electronic control boxes may be scattered throughout the space, and a plurality of control boxes in several locations may be served by a common, centralized purge air system cabinet 12 through the use of varying lengths of external conduits 14.

Within the purge air system cabinet 12, the compressed air passes serially from the inlet 19 through an inlet pressure regulator 22 associated with a first stage filter 24, through an internal conduit 26 to a second stage coalescing filter 28, and through an internal conduit 30 to a dryer 32. From the dryer 32, the air flow path divides into two paths, one to provide a continuous flow of clean, dry air, the other to provide a periodic flow of clean, dry air. As illustrated in FIGS. 1 and 2, the filters 24, 28 and dryer 32 may either be housed within the system cabinet or mounted on the exterior of the system cabinet.

Preferably, the compressed air is supplied between 90 and 150 psig. The inlet pressure regulator 22 ensures that the air flow into the filtering and drying system within the cabinet 12 is maintained within a desired pressure range.

The illustrated first stage filter 24 has a float drain 25 at the bottom of the filter through which moisture may drain. The second stage coalescing filter 28 removes oil contaminants and other liquid which might enter the system. A pet cock-manual drain 29 may also be provided at the bottom of the coalescing filter bowl for removal of oil.

Preferably, the dryer 32 comprises a bed of a desiccant material such as silica gel through which the air passes. The silica gel will adsorb moisture from the air, drying the air to a moisture level of about 1 part water in 10,000 parts air, by weight.

Silica gel has the advantageous property of changing color from blue to pink as it becomes saturated. Accordingly, it is preferred that an observation port 34 through which the color of the silica gel may be observed be included. The observation port 34 may be provided on the body of the dryer itself, as shown in the FIG. 2 embodiment, or if the dryer is enclosed within the cabinet 12, the observation port may be in the cabinet, as shown in the FIG. 1 embodiment. If desired, a comparator chart 35 may be provided around the observation port so that the color of the desiccant may be compared to the chart to determine the level of hydration of the desiccant. When it is observed that the silica gel has become saturated with water, the desiccant bed may be changed, with fresh silica gel placed in the dryer in the cabinet.

For the continuous flow of clean, dry air, a conduit 36 leads from the dryer 32 to a continuous flow outlet, or port 37 on the outside of the cabinet 12. The continuous flow outlet 37 may be provided with a suitable fitting, as will be understood by those skilled in the art, such as a male or female pipe connection, for connection to a complementary end of an external conduit. A valve or plug may also be provided for use in stopping the continuous flow outlet when not in use. If a valve is used, the valve may be a manually controlled valve operable from the outside of the cabinet, and may be of a type to simply turn the flow on or off as desired, or may comprise a variable-orifice flow control valve. Alternatively, a by-pass valve may be incorporated within the cabinet, to switch the flow back and forth from continuous to periodic flow; in such a case, it is preferred that the by-pass valve be operable by a switch mechanism 38 on the exterior of the purge air system cabinet; the switch 38 may be lighted to indicate when air is flowing out of the cabinet.

For periodic flow of clean, dry air, a branch conduit 39 leads from the dryer 32 through an outlet pressure regulator 40 to an intermittent or periodic flow control valve 42. From the valve 42, a conduit 44 leads to an outlet manifold 50 on the outside of the cabinet 12. From the outlet manifold 50, external conduits 14 lead to the remote control boxes 16 containing the electronic components. Exterior knob 23 controls the pressure regulator 40. A pressure gauge 51, observable from the outside of the cabinet 12, may be connected to the conduit 44 between the valve 42 and the manifold 50.

The outlet pressure regulator 40 provides control over back pressure on the silica gel desiccant bed and limits flow of dry air to the manifold.

The multi-ported manifold 50 may have any number and size of ports for connection to the external conduits. In the illustrated embodiment, six - one-eighth inch ports 50A are provided on the manifold, and the external conduits 14 have complementary ends for connection to the ports 52. Plugs 53 may be used to isolate manifold ports that are not in use. Push lock bulkhead fittings and variable-orifice flow control valves may be used with the manifold. Multiple flow regulating valves may be provided for controlling flow to multiple control boxes. For the external conduits 14, plastic tubing may be used for both continuous and periodic flow.

Preferably, the purge air system cabinet delivers dry, oil-free air from the continuous flow and periodic flow outlets at about ten cubic feet per minute (SCFM).

The illustrated periodic flow control valve 42 is controlled by a timer 54. The timer 54 allows or causes the valve 42 to open periodically to allow air to flow through the conduit 44 to the outlet manifold 50. The timer keeps the valve 42 open for a select period of time, and then allows or causes the valve to close and remain closed for another select period of time. Preferably, the timer is adjustable so that the time periods during which the valve 42 is open and closed are adjustable from the exterior of the cabinet 12.

In the illustrated embodiment, the periodic flow control valve 42 is a solenoid valve and the timer 54 comprises an electronic circuit board electrically connected to the solenoid valve and mounted within the purge air system cabinet. The timer and solenoid valve receive electrical power from any suitable source, such as an AC source. The timer is adjustable by means of controls 56 on the exterior of the purge air system cabinet 12. The timer 54 and controls 56 allow for adjustment of the purge air timing cycle, including both the time span of each burst of purge air and the time interval between such bursts. For example, the timer may allow for setting the length of time for each purge air burst in the range of from one to thirty seconds, and may allow the interval between bursts of purge air to be set in the range from one to sixty minutes, thus allowing a great deal of flexibility in the timing of the purge air cycle.

It is generally expected that after the air within the remote electronic control boxes 16 has been dried, dryness within the control boxes may be maintained without a continuous flow of dry air into the control boxes. A periodic flow of clean, dry air from the cabinet 12 to the electronics control boxes 16, in short bursts, should be sufficient to maintain the desired maximum humidity levels within the cabinets. An advantage of utilizing such short bursts of dry air lies in the increased working life of the desiccant bed in the dryer: with a lower volume of air passing through the desiccant bed, less moisture is absorbed by the desiccant over a given period of time, and the working life of the desiccant may be maximized while continuing to maintain desired maximum humidity levels in the remote electronics control boxes.

The flexibility provided by the present invention is advantageous in optimizing the purge air timing cycle to maintain adequate dryness within the control boxes while also maximizing the working life of the desiccant bed. The cycle times may be set to take into account special conditions in the particular setting, such as unusually high or low ambient humidity, and be set to provide a burst of purge air for the minimum time at the minimum intervals necessary to maintain the desired level of dryness within the control boxes, while at the same time not exceeding the amount necessary so that the working life of the desiccant bed is maximized. Various feedback mechanisms may also be employed in conjunction with the timing circuit: for example, humidity sensors may be employed in the control boxes, with input into a processor within the purge air cabinet to automatically vary the timing cycle based upon ambient humidity levels.

The present invention has the additional advantage of providing the alternative of a continuous flow of clean, dry air where and when needed. For example, for initial drying of a remote electronic control box, it may be desirable to first supply a continuous flow of clean dry air through a conduit connected to the continuous flow outlet 37, to purge the control box of dirty, moisture-laden air; thereafter, the control box may be connected to one of the periodic flow ports on the manifold, with dryness being maintained by the short bursts of purge air delivered periodically.

For initial drying of the remote control boxes, the period of clean and dry air flow may be adjusted to correspond to the volume of air in the control boxes, allowing a sufficient volume of clean dry air to substantially fill the control boxes with clean dry air. The intervals of non-flow may be related to the time required for ambient air to enter the control boxes, such that bursts of clean dry air are delivered to the control boxes at intervals to compensate for the entry of ambient air into the boxes.

An additional advantage of the present invention lies in the fact that purge air is delivered to a plurality of remote control boxes from one centralized location. Rather than maintaining a dry air source for each remote electronic control box, only one central purge air system cabinet need be observed and maintained for both continuous and periodic flow needs.

As shown in FIG. 1, the filters 24, 28 and dryer 32 may be housed within the interior of the cabinet 12, with the observation port 34 provided in the wall of the cabinet. However, since the filters and dryer require periodic maintenance, it is preferred that the dryer 32 and the filters 24, 28 be mounted on an exterior wall of the cabinet as shown in FIG. 2, so that the filters and dryer are accessible from the outside of the cabinet for ease in maintenance. Suitable means, such as threaded apertures (not shown), are provided in the cabinet to receive the filters and dryer and for fluid communication between the externally mounted components and the components housed within the interior of the cabinet. In the case of an externally-mounted dryer, an observation port 34 may be provided in the dryer housing itself, as shown in FIG. 2.

While a preferred embodiment of the invention has been shown and described, various changes may be made in the purge air system of this invention without departing from the true spirit and scope of the invention as set forth in the claims.

I claim:

1. A dry air system for providing a source of continuous and intermittent flow of dry air, the system comprising:
    an air source;
    a dryer connected to receive air from the air source for removal of moisture from the air;
    a continuous flow outlet connected to receive dry air from the dryer and providing an outlet for a substantially continuous flow of substantially dry air;
    an intermittent flow valve connected to receive dry air from the dryer, the intermittent flow valve being operable to open intermittently to provide an intermittent flow of substantially dry air; and
    an intermittent flow outlet connected to the intermittent flow valve to provide an outlet for an intermittent flow of substantially dry air.

2. A dry air system as claimed in claim 1 wherein the intermittent flow valve comprises a solenoid valve and further including a timer connected to energize the solenoid valve in cycles so that the solenoid valve provides flow periods followed by non-flow periods.

3. A dry air system as claimed in claim 2 wherein the timer is adjustable so that the time of flow periods is adjustable and the time of non-flow periods is adjustable.

4. A dry air system as claimed in claim 1 further comprising a coalescing filter disposed to receive air from the air source and to deliver filtered air to the dryer.

5. A dry air system as claimed in claim 4 further comprising a first stage filter disposed to receive air from the air source and to deliver filtered air to the coalescing filter.

6. A purge air system providing a common source of a periodic flow of dry air and a continuous flow of dry air for delivery to a plurality of remote control boxes containing electronic components, the purge air system comprising:
    an air source;
    a common cabinet including
        an inlet for receipt of air from the air source;
        a dryer connected to receive air from the inlet for removal of moisture from the air;
        a continuous flow outlet connected to receive dry air from the dryer;
        a periodic flow outlet connected to receive dry air from the dryer to provide a source of periodic flow of dry air;

a periodic flow valve connected to regulate the flow of dry air from the dryer to the periodic flow outlet; and conduits connecting the outlets to the remote control boxes.

7. A purge air system as claimed in claim 6 further comprising a timer connected to the periodic flow valve so that the valve is open to allow dry air to flow for a time period determined by the timer and so that the valve is closed to prevent dry air from flowing for a time period determined by the timer.

8. A purge air system as claimed in claim 7 wherein the timer is adjustable and further comprising external controls mounted on the cabinet and connected for control of the timer so that the time spans of flow periods and periods of non-flow may be adjusted from the outside of the cabinet.

9. A purge air system as claimed in claim 6 wherein the dryer comprises a desiccant bed observable through an observation port.

10. A purge air system as claimed in claim 6 further comprising a coalescing filter connected between the inlet and the dryer for filtration of the air prior to delivery to the dryer.

11. A purge air system as claimed in claim 10 further comprising a first stage filter connected between the inlet and the coalescing filter for filtration of the air prior to filtration in the coalescing filter.

12. A purge air system as claimed in claim 11 wherein the first stage filter, coalescing filter and dryer are mounted on an exterior wall of the cabinet so that the filters and dryer are accessible from the outside of the cabinet.

13. A purge air system as claimed in claim 6 further comprising:
   an inlet pressure regulator disposed between the inlet and the dryer to regulate the pressure of the air entering the dryer; and
   an outlet pressure regulator disposed between the outlets and the dryer for regulating back pressure on the dryer.

14. A purge air system for providing an adjustable cyclical flow of dry air, the purge air system comprising:
   an air source;
   a dryer for removal of water from air, the dryer being connected to receive air from the air source;
   a periodic flow valve connected to regulate the flow of dry air from the dryer;
   an adjustable timer connected to regulate the operation of the periodic flow valve so that dry air may flow through the periodic flow valve for a period of from one to thirty seconds followed by a period of non-flow of from one to sixty minutes.

15. A purge air system as claimed in claim 14 further comprising a continuous flow line connected to the dryer output to bypass the periodic flow valve.

16. A purge air system as claimed in claim 14 wherein the purge air system provides a common source of a periodic flow of dry air for delivery to a plurality of remote control boxes containing electronic components, the purge air system further comprising a common cabinet housing the dryer, periodic flow valve and timer, and the common cabinet including an outlet manifold providing a plurality of ports for connection to the remote control cabinets for delivery of periodic bursts of dry air to the remote control cabinets.

17. A purge air system for providing an adjustable cyclical flow of dry air to a plurality of remote control boxes, the purge air system comprising:
   an air source;
   a dryer connected to receive air from the air source for removal of moisture from air delivered from the air source, the dryer having an outlet for delivery of dry air;
   a periodic flow valve connected to regulate the flow of dry air from the dryer;
   an adjustable timer connected to regulate the operation of the periodic flow valve so that dry air may flow out for a period followed by a period of non-flow;
   a common cabinet holding the dryer, periodic flow valve and timer, the common cabinet including an outlet manifold providing a plurality of ports, the outlet manifold being connected to receive the regulated flow of dry air; and
   conduits connecting the outlet manifold ports to the remote control boxes.

18. A purge air system as claimed in claim 17 further comprising a continuous flow line connected to receive dry air from the dryer output and to bypass the periodic flow valve.

19. A purge air system as claimed in claim 17 further comprising a first stage filter connected upstream of the dryer for filtering of air from the air source prior to drying in the dryer.

20. A purge air system as claimed in claim 19 further comprising a coalescing filter connected between the first stage filter and the dryer for treatment of air from the first stage filter prior to drying in the dryer.

21. A purge air system as claimed in claim 20 wherein the filters and dryer are mounted on the exterior of the cabinet so that the filters and dryer are accessible from the exterior of the cabinet.

* * * * *